US009717145B2

(12) United States Patent
Subramanian et al.

(10) Patent No.: US 9,717,145 B2
(45) Date of Patent: Jul. 25, 2017

(54) THROUGH SILICON VIAS AND THERMOCOMPRESSION BONDING USING INKJET-PRINTED NANOPARTICLES

(71) Applicant: The REGENTS OF THE UNIVERSITY OF CALIFORNIA, Oakland, CA (US)

(72) Inventors: Vivek Subramanian, Orinda, CA (US); Jacob Sadie, San Francisco, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/953,200

(22) Filed: Nov. 27, 2015

(65) Prior Publication Data
US 2016/0148840 A1 May 26, 2016

Related U.S. Application Data

(63) Continuation of application No. PCT/US2014/039958, filed on May 29, 2014.
(Continued)

(51) Int. Cl.
H05K 1/09 (2006.01)
H05K 1/11 (2006.01)
(Continued)

(52) U.S. Cl.
CPC .......... *H05K 1/097* (2013.01); *B23K 3/0638* (2013.01); *H01L 21/288* (2013.01);
(Continued)

(58) Field of Classification Search
CPC ............. H01L 21/768; H01L 21/76838; H01L 21/76868; H05K 1/09; H05K 1/092;
(Continued)

(56) References Cited

U.S. PATENT DOCUMENTS 5,108,785 A * 4/1992 Lincoln ............... H01L 21/4807
347/1
8,404,160 B2 * 3/2013 Li .......................... B22F 1/0022
106/31.92
(Continued)

OTHER PUBLICATIONS

Korean Intellectual Property Office (KIPO), International Search Report and Written Opinion, PCT/US2014/039958, issued Oct. 8, 2014, pp. 1-11, with claims searched, pp. 12-17. Counterpart to the application filed herewith.

*Primary Examiner* — Eduardo A Rodela
(74) *Attorney, Agent, or Firm* — O'Banion & Ritchey LLP; John P. O'Banion

(57) ABSTRACT

Apparatus and method for filling and optionally bumping through-silicon vias (TSVs) in device circuits utilizing inkjet printheads for ejecting sufficiently small droplets of conductive nanoparticle inks into the TSVs. Ejected drops are accurately impinged along the length of each TSV within a substrate being heated to drive evaporation of the solvent carrying the metal nanoparticles into the trenches while not de-encapsulating the particles. Once all TSVs are filled, and optionally bumped, to a desired level while they are being heated then bonding and sintering can be performed, such as utilizing thermocompression bonding to another integrated circuit.

24 Claims, 7 Drawing Sheets

Related U.S. Application Data

(60) Provisional application No. 61/829,803, filed on May 31, 2013.

(51) Int. Cl.

| | | |
|---|---|---|
| *H01L 21/768* | (2006.01) | |
| *B23K 3/06* | (2006.01) | |
| *H01L 23/00* | (2006.01) | |
| *H01L 21/288* | (2006.01) | |
| *H01L 21/67* | (2006.01) | |
| *H01L 21/66* | (2006.01) | |
| *H01L 25/065* | (2006.01) | |
| *H01L 25/00* | (2006.01) | |

(52) U.S. Cl.
CPC ........ *H01L 21/6715* (2013.01); *H01L 21/768* (2013.01); *H01L 21/76838* (2013.01); *H01L 21/76868* (2013.01); *H01L 21/76882* (2013.01); *H01L 21/76898* (2013.01); *H01L 22/20* (2013.01); *H01L 24/11* (2013.01); *H01L 24/13* (2013.01); *H01L 24/742* (2013.01); *H01L 24/75* (2013.01); *H01L 24/81* (2013.01); *H01L 25/0657* (2013.01); *H01L 25/50* (2013.01); *H05K 1/09* (2013.01); *H05K 1/092* (2013.01); *H05K 1/115* (2013.01); *H01L 2224/02372* (2013.01); *H01L 2224/117* (2013.01); *H01L 2224/11318* (2013.01); *H01L 2224/13009* (2013.01); *H01L 2224/13025* (2013.01); *H01L 2224/16113* (2013.01); *H01L 2224/16148* (2013.01); *H01L 2224/742* (2013.01); *H01L 2224/759* (2013.01); *H01L 2224/75251* (2013.01); *H01L 2224/75804* (2013.01); *H01L 2224/75981* (2013.01); *H01L 2224/8184* (2013.01); *H01L 2224/81193* (2013.01); *H01L 2224/81203* (2013.01); *H01L 2224/94* (2013.01); *H01L 2225/06513* (2013.01); *H01L 2225/06541* (2013.01); *H01L 2924/14* (2013.01); *H01L 2924/20108* (2013.01)

(58) Field of Classification Search
CPC .......... H05K 1/097; H05K 1/11; H05K 1/113; H05K 1/115; H05K 3/00; H05K 3/0008; H05K 3/107; H05K 3/12; H05K 3/1241; H05K 3/125
See application file for complete search history.

(56) References Cited

U.S. PATENT DOCUMENTS

| | | | |
|---|---|---|---|
| 2004/0000429 A1* | 1/2004 | Furusawa | H05K 3/4647 174/264 |
| 2004/0061232 A1* | 4/2004 | Shah | H01L 21/4857 257/758 |
| 2005/0148154 A1 | 7/2005 | Ogawa | |
| 2007/0148972 A1* | 6/2007 | Hara | H01L 21/288 438/687 |
| 2007/0175296 A1* | 8/2007 | Subramanian | B22F 1/0022 75/362 |
| 2007/0211107 A1* | 9/2007 | Ikeda | B41J 2/145 347/47 |
| 2008/0016686 A1* | 1/2008 | Lee | H05K 3/0014 29/846 |
| 2008/0122897 A1* | 5/2008 | Toyoda | B41J 3/28 347/54 |
| 2008/0136861 A1* | 6/2008 | Free | B41J 2/04 347/21 |
| 2008/0171430 A1 | 7/2008 | Kamins | |
| 2008/0242079 A1 | 10/2008 | Xu et al. | |
| 2009/0274833 A1* | 11/2009 | Li | B22F 1/0022 427/123 |
| 2010/0154211 A1 | 6/2010 | Uyama | |
| 2011/0219612 A1 | 9/2011 | Jacquet et al. | |
| 2012/0146242 A1* | 6/2012 | Fujishima | H01L 21/561 257/777 |
| 2015/0129978 A1* | 5/2015 | Moon | H01L 21/76898 257/394 |
| 2015/0189761 A1* | 7/2015 | Chan | C09D 11/52 427/125 |

\* cited by examiner

THROUGH SILICON VIAS AND THERMOCOMPRESSION BONDING USING INKJET-PRINTED NANOPARTICLES

CROSS-REFERENCE TO RELATED APPLICATIONS

This application is a 35 U.S.C. §111(a) continuation of PCT international application number PCT/US2014/039958 filed on May 29, 2014, incorporated herein by reference in its entirety, which claims priority to, and the benefit of, U.S. provisional patent application Ser. No. 61/829,803 filed on May 31, 2013, incorporated herein by reference in its entirety. Priority is claimed to each of the foregoing applications.

The above-referenced PCT international application was published as PCT International Publication No. WO 2014/194049 on Dec. 4, 2014, which publication is incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

1. Technical Field

This disclosure pertains generally to filling through vias in support of integrated circuit interconnections, and more particularly to a using an inkjet printer for filling through vias within integrated circuits.

2. Discussion

Semiconductor packaging applications often require the integration of three-dimensional (stacked) packages toward increasing effective circuit functionality per area. Vias in these circuits, known as through-silicon-vias (TSVs) are widely recognized as one of many necessary building blocks for realizing this stacking capability. Although the concept of chip-stacking is known, TSV development is a nascent area of research with fully effective methods for filling TSVs not yet established.

TSVs are currently being fabricated using deep reactive ion etching (DRIE) or laser drilling on silicon-on-insulator (SOI) wafers and the via formation may occur before complementary metal-oxide semiconductor (CMOS) fabrication, between CMOS and back-end-of-line (BEOL) processing, after BEOL processing, or after die bonding. It will be noted that BEOL processing is the second portion of integrated circuit (IC) fabrication where the individual devices (transistors, capacitors, resistors, and so forth) are interconnected with wiring. Current approaches for filling these etched or drilled vias include copper electroplating, tungsten filling, and insulation of highly doped silicon. Potential alternatives can include varying the deposited material for electroplating or chemical vapor deposition (CVD) and the introduction of atomic layer deposition (ALD) for very small and high aspect ratio TSVs. Or if on-chip processing of TSVs is avoided altogether, then alternatives include use of silicon interposers and stacked wire bond devices provide potential alternatives.

There are drawbacks to each of these processes, many of the more practical of which are wafer-scale, blanket deposition, subtractive techniques which requires multiple processing steps in order to obtain an insulated, fully-filled via plug.

Therefore, a method is needed for performing rapid TSV filling and bumping with a die-scale to wafer-scale additive process which is tunable and that reduces material consumption.

BRIEF SUMMARY

Through-silicon-vias (TSVs) are filled and optionally bumped according to the technology described herein using inkjetted nanoparticulates. This inkjet printing is used to realize high-throughput filling and bumping of (TSVs) for back-end-of-line (BEOL) semiconductor processing applications. It will be appreciated that the technology described herein is applicable to through vias in other integrated circuit materials, including all semiconductors in use, such as silicon, sapphire, germanium, gallium arsenide (GaAs), alloys of silicon and germanium, indium phosphide (InP) and so forth.

Utilizing inkjet printing for filling these TSVs provide numerous advantages. Using inkjets, the conductive (e.g., metal) nanoparticle inks can be utilized for bumping as well as filling the TSVs. It should be appreciated that metal nanoparticle inks demonstrate higher conductivities and lower processing temperatures than are required by conventional eutectic solder bumps. Inkjet TSV filling-bumping is also an additive process which reduces total material consumption and processing cost. TSV filling and bumping with printed metal nanoparticle inks requires only a single process step and upon sintering these nanoparticles reflow to form conductive plugs and/or bumps.

Further aspects of the technology described herein will be brought out in the following portions of the specification, wherein the detailed description is for the purpose of fully disclosing preferred embodiments of the technology described herein without placing limitations thereon.

BRIEF DESCRIPTION OF THE SEVERAL VIEWS OF THE DRAWING(S)

The disclosure will be more fully understood by reference to the following drawings which are for illustrative purposes only:

DETAILED DESCRIPTION

Apparatus and methods for the filling and bumping of through-silicon-vias (TSV) based on the additive process of inkjet printing are described. Benefits of this TSV filling process consume less material and can be scaled to effectively meet die-level or wafer-level needs. Nanoparticles are particularly attractive materials due to depressed melting points relative to their bulk counterparts allowing for dramatically reduced processing temperature requirements as well as electromigration-free operation.

A common issue in current TSV technology is the management of stress due to the coefficient of thermal expansion (CTE) mismatch between the semiconductor (e.g., silicon) and the deposited via material. Nanoparticle inks, according to the technology described herein, offer a tuning capability for minimizing the CTE mismatch in response to adjusting chemical composition and thermal treatment of the deposited ink. Accordingly, integration of via-filling and bump-fabrication enables inkjet printing to effectively fill and bump vias in a single process step that remains compatible with current thermal budget requirements and further enhances TSV performance.

The inventive inkjet-based TSV filling method can be utilized for meeting demands of medium-density to high-density TSV layouts so long as jetted drop diameter is compatible, such as being less than or equal to, the trench diameter (e.g., width of the TSV). The technology disclosed herein is particularly well-suited for the heterogeneous integration of MEMS/photonics chips onto a single substrate, stacked memory applications such as DRAM and NAND Flash, system on chip (SoC) fabrication, and many other general stacking schemes.

Figure 1:
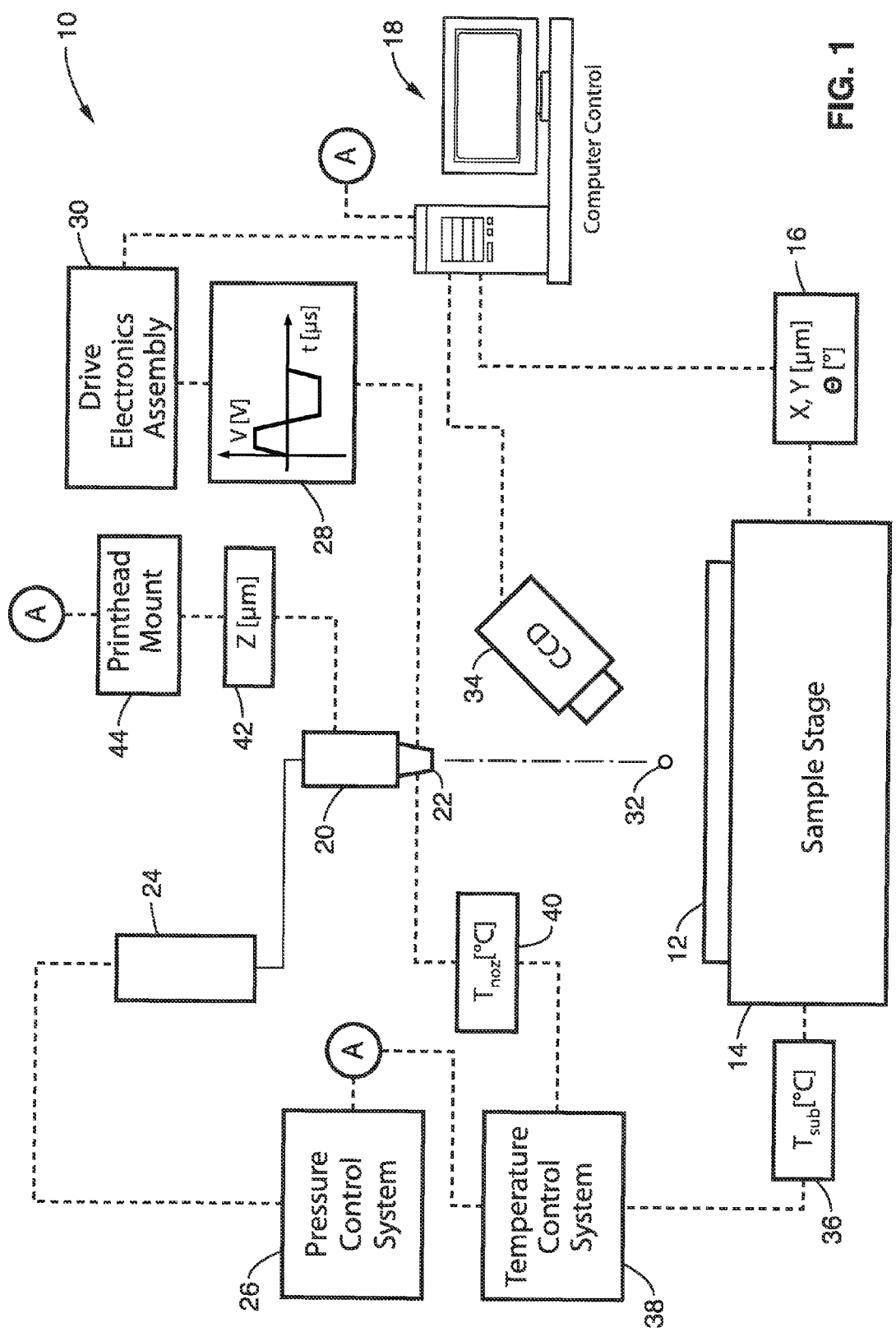
FIG. 1 is a block diagram of an apparatus for inkjet printing of through silicon vias (TSVs) according to at least one embodiment of the technology described herein.

FIG. 1 illustrates an example embodiment 10 of an inkjet system utilized according to the technology described herein. A wafer 12 is seen on a motor-driven stage 14 with vacuum capability that can translate in the x- and y-direction as well as rotate about its center for the purposes of layer-to-layer alignment, as controlled by a stage control 16, which is connected to a computer control system 18.

Computer control system 18 is exemplified as a personal computer (PC) although any form of programmable control device may be utilized (e.g., mainframes, desktops, laptops, embedded processors, and the like) having appropriate input/output (I/O) hardware and software that permits integration of the hardware elements for inkjet printing of the TSVs. At least one computer control system 18 is utilized, which contains one or more computer processors and memory within which programming is stored for execution in controlling the hardware elements of the technology described herein in the process of TSV filling and bumping. The programming may be stored on a media that is loaded onto the computer for execution. The technology described herein is non-limiting with regard to memory and computer-readable media, insofar as these are non-transitory, and thus not merely constituting a transitory electronic signal.

A printhead 20 with nozzle 22 is shown mounted above the translation stage 14. A preferred form of printhead is piezoelectric for providing sufficiently small droplet sizing 32. An ink reservoir 24 is shown for supplying ink, such as nanoparticle-based inks or other inks as desired, through a non-reactive tubing material. A back-pressure system 26 is configured with control valves to adjust the pressure on the back of the ink reservoir 24 and thus regulate ink pressure at the feed end of the printhead ink reservoir 24 to assure proper ink flow from nozzle 22. The pressure control system 26 is preferably connected to computer system 18 for monitoring and controlling ink pressure. Printhead driver electronics 30 are configured for generating a tunable output pulse waveform 28 to the nozzle 22 in response to computer control. In this embodiment, both the wafer stage and nozzle are configured for being controllably heated.

It should be appreciated that the system described above provides a stage for movement in x and y (horizontal directions) as well as an angular direction, with the printhead configured for movement in the z direction (vertical). However, it should be appreciated that the present system may utilize any mechanism which provides for relative motion between the integrated circuit whose vias are being filled, and the printhead. Accordingly, the printhead itself could be configured for performing all the necessary motion relative to a fixed integrated circuit, or the device retaining the integrated circuit may be adapted to provide all necessary movement, or any combinations of movement between these two elements may be utilized without departing from the technology described herein. It should be appreciated, however, that integrated circuit stages already exist which retain a wafer of integrated circuit die while providing controlled horizontal and rotational movements for use in testing and various other wafer processing steps. Any of these forms can be utilized if configured to provide the necessary positioning and movement accuracy as a means for generating relative motion between an inkjet printhead and the stage which retains the integrated circuit whose vias are filled.

A temperature control system 38 regulates heat generated at a stage heater 36 coupled to translation stage 14 and positioned to heat the retained wafer at an elevated temperature (above room temperature) up to 300° C. If performing TSV filling after any FEOL processes, however, the operating substrate temperature is preferably limited to maintain thermal budgets of extended processing on fabricated device layers, such as under 200° C. It will be appreciated that the system can employ the above means or any desired means for heating the integrated circuit on the stage without departing from the teachings of the technology described herein (e.g., direct electrical heating, indirect heating, infrared heating, laser heating, and other known heating methods and combinations thereof). Sensors are also preferably configured in combination with heater 36 to sense the actual temperature of the wafer. Temperature control system 38 also controls a nozzle heater 40 thermally coupled to nozzle 22. Temperature control 38 is preferably coupled to computer system 18 for monitoring stage and nozzle temperatures. It is important to control the nozzle temperature to offset any convective effects since the printhead may be operating above a heated substrate. In the current operation of the printer for TSV filling, the nozzle temperature is usually set to a value ranging between 35° C. to 45° C. This is generally the setpoint for printhead operation approximately 300 μm above the substrate and substrate operation at approximately 100° C. to 130° C. In at least one embodiment, a physical shield, such as a metal aperture, shields the nozzle from the rising heat and acts as a heat sink. The inkjet printhead 20 is also configured with a vertical translation stage 42 attached to a printhead mount 44. Printhead mount control 44 is preferably connected to computer system 18 for monitoring and positioning of the printhead.

A camera system is shown with at least one imager 34 (e.g., charge-coupled device (CCD) image) shown coupled to computer 18 to provide in-situ viewing of printing processes. In at least one embodiment of the technology described herein video recognition software is installed on computer 18 so that the process can be directly and automatically controlled in response to video captured in-situ of the TSV filling and bumping process. A calibration process operates to align inkjet droplets received on the die. Both the positioning, and thresholds in regards to filling amount, can be determined by the optional optical recognition means.

Figure 2A:
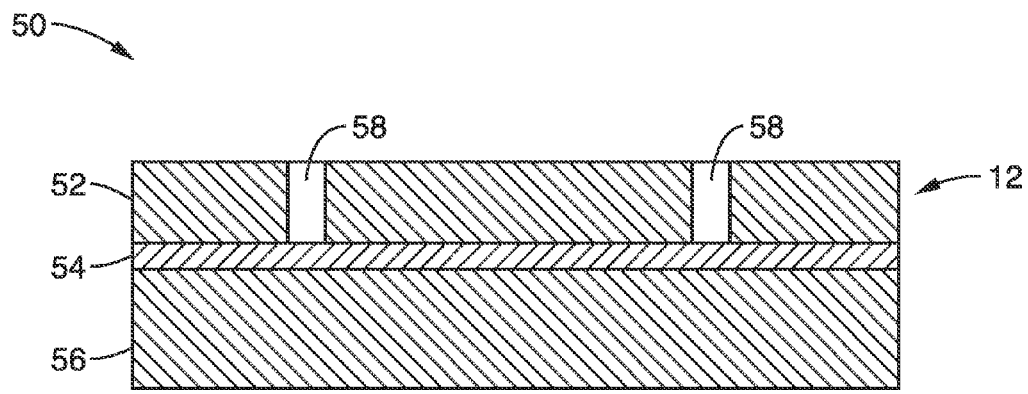
FIG. 2A through FIG. 2E are cross-section views showing steps for inkjet printing of TSVs and thermocompression bonding according to at least one embodiment of the technology described herein.
Figure 2B:
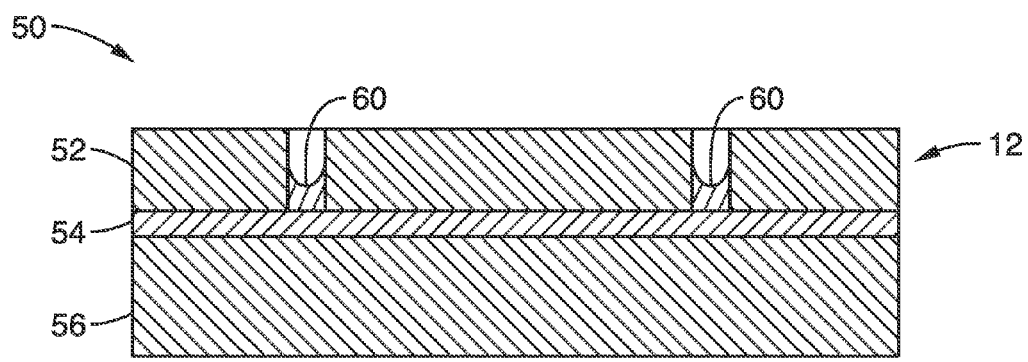
Figure 2C:
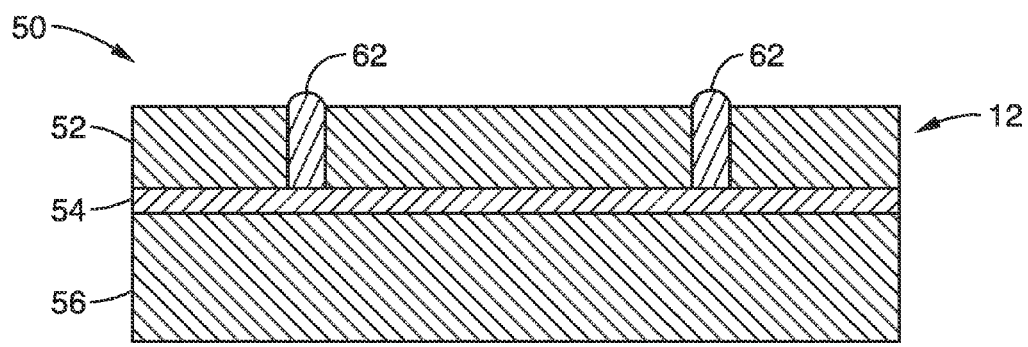
Figure 2D:
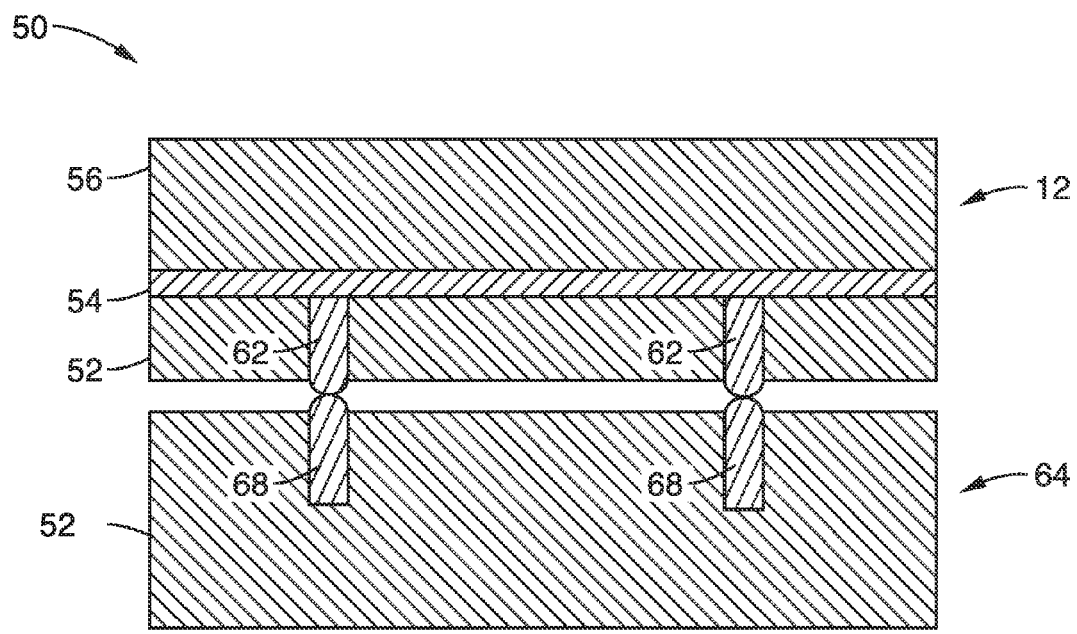
Figure 2E:
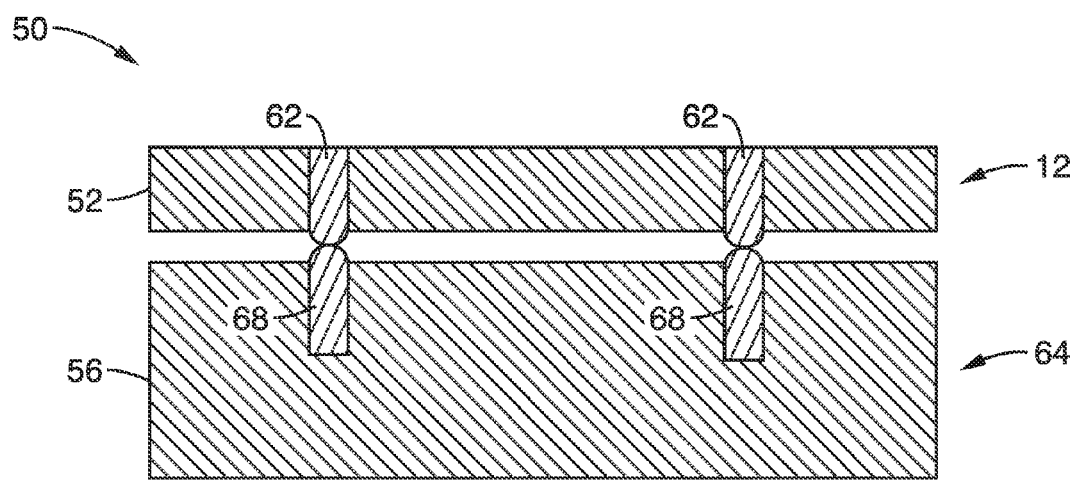

FIG. 2A through FIG. 2E illustrate a general process flow showing steps represented as a sequence of cross sectional views of an embodiment 50 for inkjet TSV filling and bumping. In FIG. 2A a wafer or die 12 is shown, exemplified as silicon-on-insulator (SOI) with a silicon layer 52, buried insulator layer 54 and a base layer 56 which typically comprises bulk silicon. TSV trenches 58 (e.g., pre-fabricated) are seen in the device silicon layer 52. The SOI wafer with TSV trenches is placed onto a vacuum-chuck with heating capability according to the technology described herein. Next, metal nanoparticle ink is dispensed in a drop-wise manner through an inkjet nozzle into the trenches, as seen in partially filled TSVs 60 in FIG. 2B, while heat is applied to the wafer. The heat drives evaporation of the solvent carrying the metal nanoparticles into the trenches but does not de-encapsulate the particles, which would cause coalescence and film formation. After a sufficient number of drops are dispensed to fully fill the trench, the process may be terminated or continue in the same manner to fabricate bumps at the top of the TSVs as seen by bumped TSVs 62 in FIG. 2C. Once the TSVs are filled, and bumped as desired, the wafer/die is removed from the chuck and bonded to a previously processed wafer to complete the package as seen in FIG. 2D. In this figure, the wafer 12 from FIG. 2C is shown upside down upon a previously fabricated wafer 64 having a device material 66 (e.g., semiconductor) with filled TSVs 68. Thermocompression bonding is then performed at a temperature greater than (above) the sintering temperature of the nanoparticles to cause nanoparticle de-encapsulation within the TSV. During de-encapsulation, the organic encapsulant bonds break from the nanoparticles, allowing the nanoparticles to diffuse, melt, and coalesce upon contact, forming a solid film within the TSV. After the bonding process, the unneeded base layer 56 and insulator 54 are typically removed from the first device, resulting in the bonded wafers seen in FIG. 2E.

Figure 3:
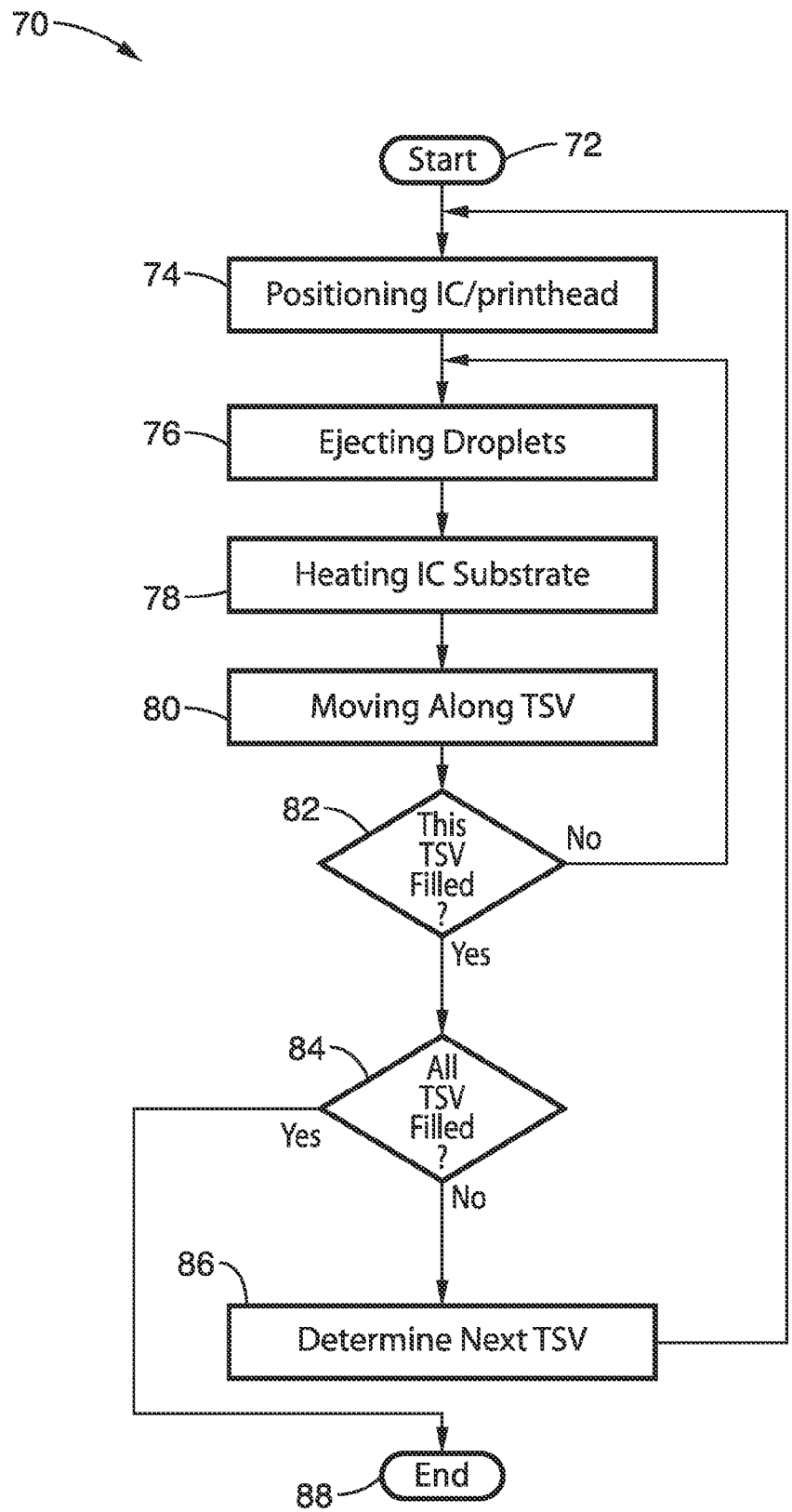
FIG. 3 is a flow diagram of the general process for filling and optionally bumping TSVs according to at least one embodiment of the technology described herein.

FIG. 3 illustrates an embodiment 70 of TSV filling and optional bumping according to the technology described herein. The process starts 72 with relative positioning 74 performed between the printhead and TSV to be filled. One or more droplets are ejected 76 from the printhead to fill the TSV. During the filling process, the integrated circuit, or at least the TSV being filled, is heated 78. Relative movement between integrated circuit and printhead is performed 80 so that droplets can fill other portions of the TSV. If the TSV is not filled to the desired level, as detected in step 82, then filling and movement continues back at step 76. When the TSV is filled then a check is made 84 if all desired TSVs have been filled. If there are more TSV to fill, then the next TSV is determined 86 and positioning performed 74 to that location. Otherwise the TSV filling process has been completed 88 for the integrated circuit and a die separation and bonding process can be performed.

Figure 4:
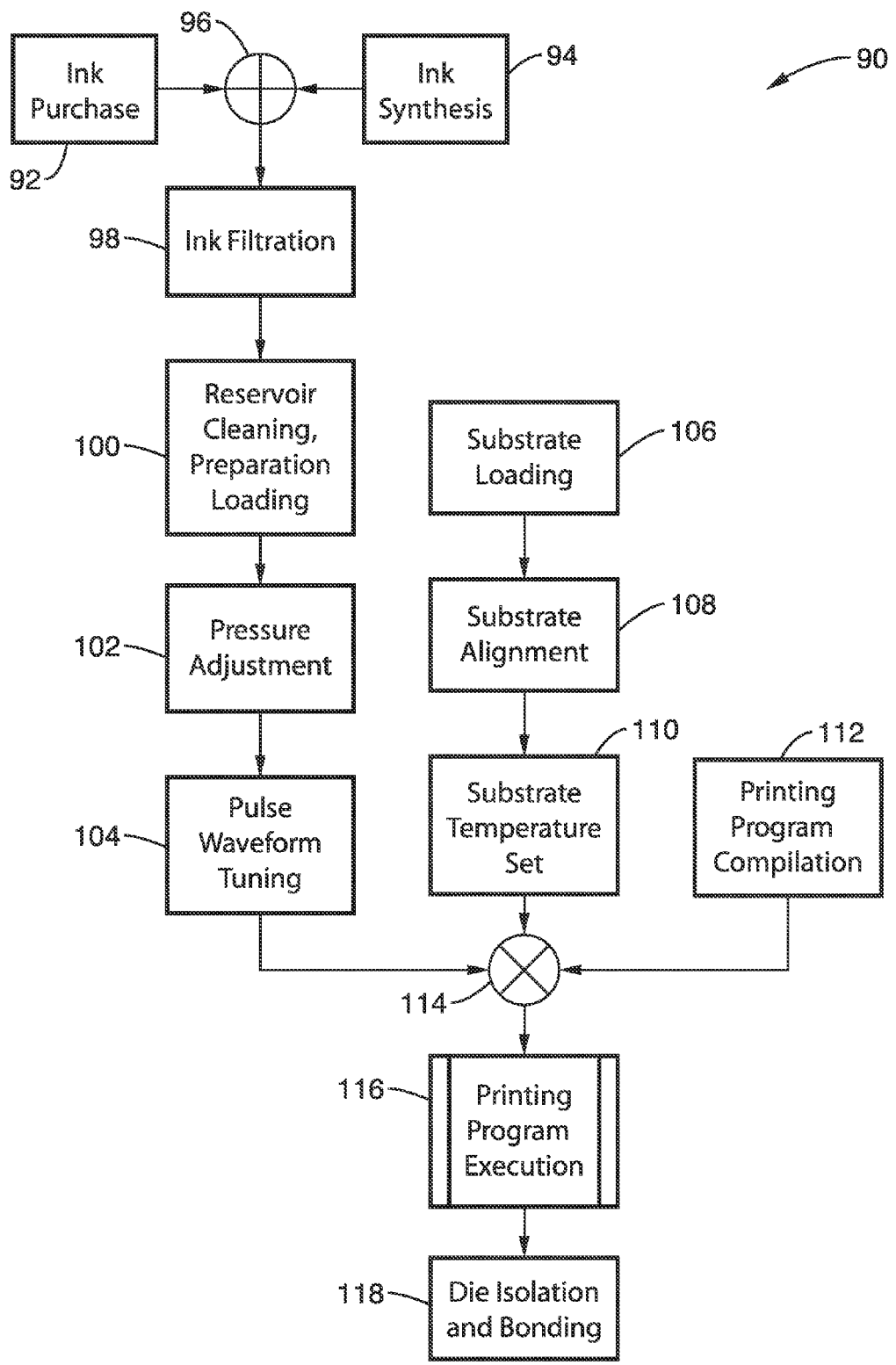
FIG. 4 is a flow diagram of sample preparation and processing for inkjet printing of TSVs and thermocompression bonding according to at least one embodiment of the technology described herein.

FIG. 4 illustrates an example flow diagram of an embodiment 90 of the general process for TSV filling and bumping with an inkjet printer for thermocompression bonding. The process depicts purchasing available ink 92 or synthesizing ink 94, or a combination of the two 96, followed by filtration 98, ink loading 100, pressure adjustment 102, tuning of pulse waveforms for the print head nozzle 104. The substrate is prepared by loading 106, such as on the vacuum chuck of a movable stage, aligning the substrate 108, and controlling substrate temperature 110 throughout the TSV filling process. A printing program 112 is loaded into the computer which orchestrates the operation of the elements, from movement of the chuck (x, y, φ), movement of the print head (z), heating, amount/rate and dispensation of drops from the print head, threshold conditions for completions of inkjet printing, and so forth. These elements interoperate 114 on the system so that during operation the programming executes 116 controlling inkjet and stage elements. Finally, die isolation and bonding 118 are performed to complete fabrication.

Figure 5:
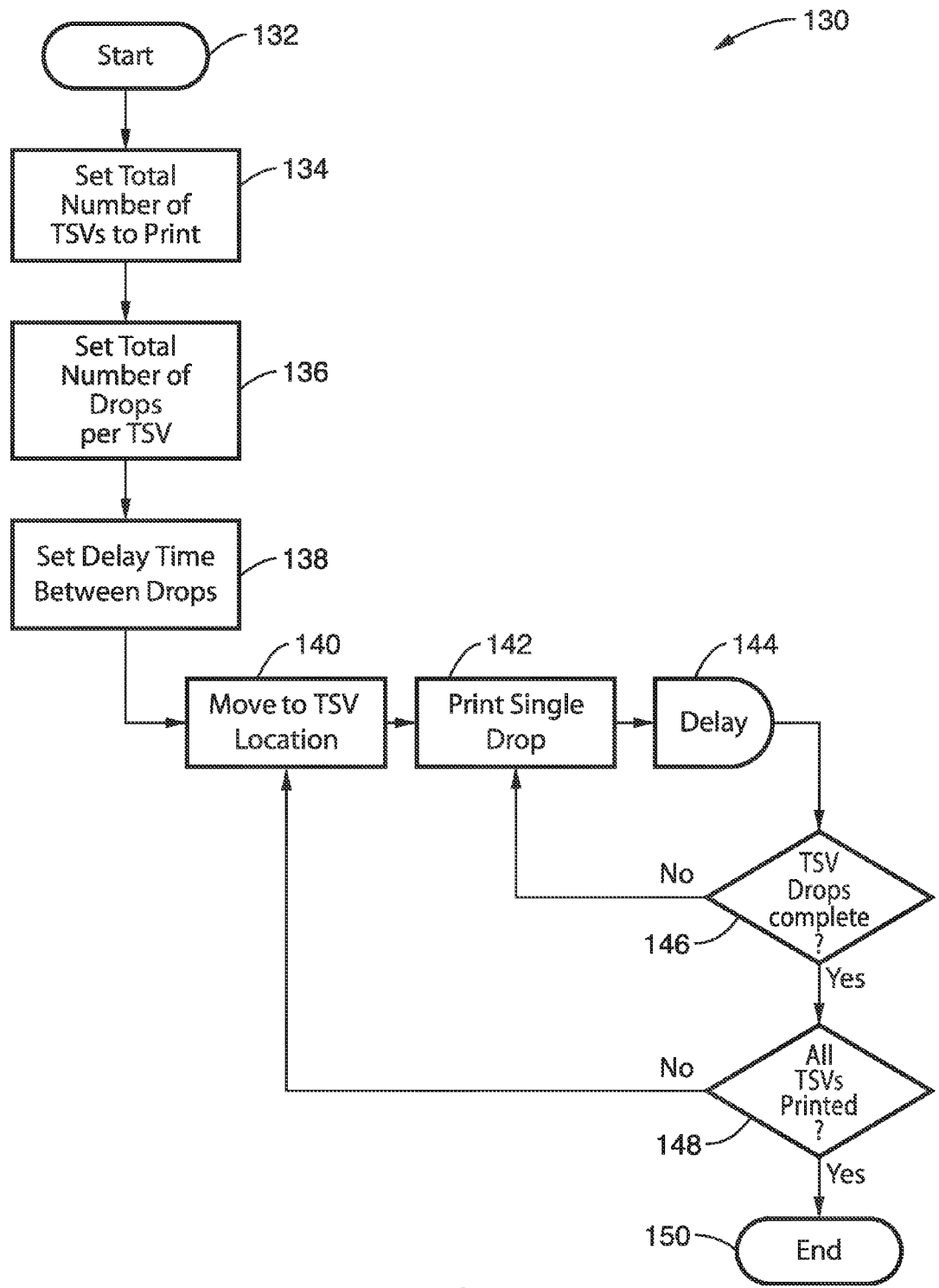
FIG. 5 is a flow diagram of a general process of inkjet printing of TSVs and thermocompression bonding according to at least one embodiment of the technology described herein.

FIG. 5 illustrates an example flow diagram of an embodiment 130 of inkjet printing for TSV filling and bumping within the technology described herein. The process starts 132 with determining the number of TSVs to print 134, then setting the amount of filling 136 for each TSV, such as the total number of droplets per TSV (or other threshold condition). A delay time 138 between drops is set which is largely dependent on wafer temperature to evaporate solvent carrying the nanoparticles to the substrate. The stage is controlled 140 to move to a TSV location on the substrate. Then an iterative process is performed, with each single drop printed 142, followed by delay 144, and a check for completion 146 or continuing with more drops. After the TSV is filled, then a check for more TSVs is performed 148. If more TSVs exist, then program execution returns back to step 140; otherwise the process is completed at step 150.

Figure 6:
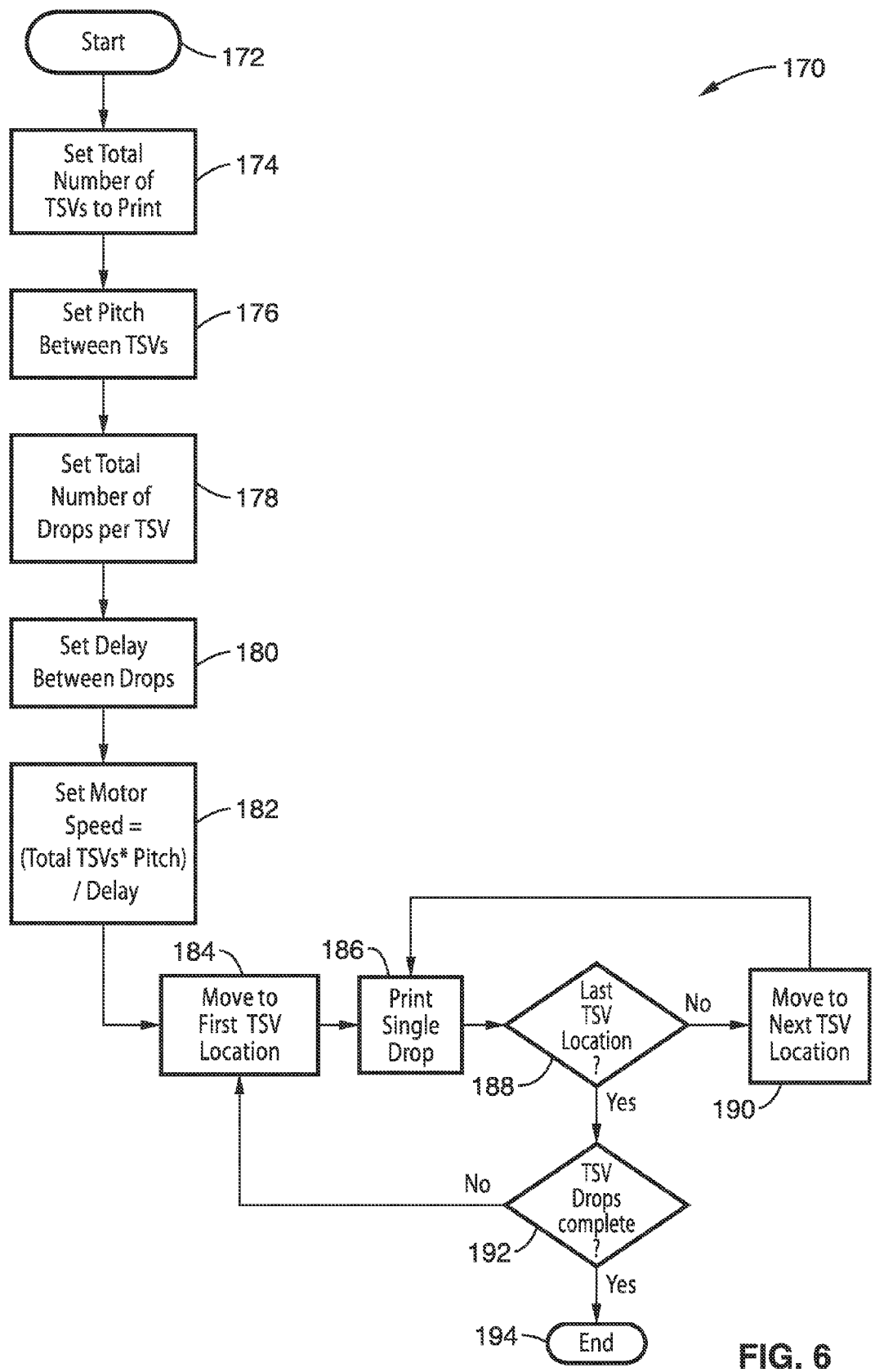
FIG. 6 is a flow diagram of a process of inkjet printing of TSVs and thermocompression bonding according to at least one embodiment of the technology described herein having a fixed pitch grid.

FIG. 6 illustrates an example flow diagram of an embodiment 170 of inkjet printing of through silicon vias (TSVs) and thermocompression bonding within the technology described herein. The process starts 172 and sets the total number of TSVs to print 174, with a constant pitch (along the x- and/or y-direction) set between TSVs 176, TSV filling threshold 178, such as drops per TSV, and delay set 180 between drop dispensing and setting of motor speed 182, such as speed=(total TSVs*pitch)/delay between drops. The process commences with a move to first TSV location 184, at which a drop is printed 186, and if a check for last TSV location 188 shows it is not the last TSV, then a move 190 to the next location is performed and execution back to step 186 at which another drop is printed. If check 188 determines the last TSV location printed, then a check for the amount of filling 192 is performed. If not filled yet, then the process returns to step 184 to the first TSV location, but if filled then the process is ended 194.

Details on certain of these elements are described in more detail in the following paragraphs.

Commercially-available nanoparticle inks are likely candidates for initial use in these printing processes due to their stability and reliable performance while offering a wide range of material options. Custom-synthesized nanoparticle inks are viable alternatives, with properties which can be tuned for use with the technology described herein, i.e. through solvent selection, through synthetic variation, through surfactant addition, and so forth. Any colloidal-based inks should be pre-filtered before dispensing into the ink reservoir toward removing any large agglomerates or other particulate contaminants that might clog the printhead nozzle. An additional filter is preferably placed between the reservoir and the printhead to eliminate any agglomerates that may form over time.

An appropriate back-pressure, such as pressure supplied by an inert gas (e.g., nitrogen), is preferably applied to the reservoir forcing proper ink flow from the reservoir through the in-line filter to the tip of the printhead nozzle. In one embodiment it was found that the pressure should be tuned such that the pressure at the head of the nozzle is very slightly negative, causing the meniscus to retreat into the nozzle.

Programming (software) for controlling the drive electronics for the printhead are configured to generate appropriate pulse waveforms at the printhead to produce reliable, stable drops (droplets). It will be appreciated that the term "drops" is utilized herein regarding ink particles emitted from the inkjet, while the term "droplets" can also be utilized as their size is typically measured in low picoliter (pL) volumes (a picoliter is a trillionth of a liter), from somewhat less than 1 pL through tens of pL (e.g., volumes up to about 50 pL). To understand the small size of these drops/droplets, it will be noted that a 2 pL volume of human blood only holds about 200 red blood cells.

The pulse waveform driving the printhead is preferably bipolar with voltage magnitudes and time scales of the waveforms adjusted to provide proper drop ejection. A typical commercially-available ink requires a pulse voltage of approximately 20 V with dwell and echo times of approximately 20 and 40 µs, respectively.

In preparation a substrate is placed and retained on the chuck, such as retained on a vacuum-chuck by applying vacuum so that the substrate does not move during the inkjet printing process. Using the installed camera system and the rotational degree of freedom in the stage, the stage can be rotated to align with previous processing steps as needed. For the purpose of filling TSVs, the substrate temperature should be set to some elevated temperature, most commonly within the range of 70° C. to 120° C., although it could be up through 200° C. or even 300° C. This temperature is sufficient to drive the evaporation of the solvent that is carrying the nanoparticles to the substrate, but not trigger the de-encapsulation of the solvent, and thus premature sintering within the structure.

An appropriate string of commands is pre-loaded into the software of the computer that drives both the jetting action of the printhead (via the driver electronics assembly) as well as the feature geometry (via the motor-driven x- and y-translation stage). The most common commands utilized are stage movement commands, delay commands, and jetting trigger commands. It should be appreciated that for TSV filling and bumping processes, one of the most important printing parameters is the substrate temperature and jetting frequency. Once a single drop lands onto the substrate, such as the trench, a suitable amount of time must pass to allow the solvent to evaporate. Once the trench is completely filled, additional drops dispensed onto the substrate should result in building a small bump on the TSV so long as the substrate temperature and jetting frequency are set properly. Thus, the TSV may be filled and bumped in a single process step, with an arbitrary resulting bump height based solely on the number of drops deposited after the filling process is complete.

If it were not for the heating of the substrate during printing, then a jetting frequency could only be attained between the range of 0.01 to 0.2 Hz, which is impractical. However, higher jetting frequencies on the order of 1000 Hz can be attained with the substrate temperature raised whereby ink solvents evaporate rapidly. It should even be possible to attain operational frequencies greater than 10 kHz if the substrate temperature does not adversely affect the drop formation at even higher temperatures.

The overall throughput of the process is improved by printing multiple single drops into trenches before returning to the original TSV and repeating the pattern. In FIG. 6 this throughput enhancement has been exemplified for a constant-pitch grid, however the general principle can apply to arbitrary TSV patterns so long as TSV positions are known. The throughput of the system can reach manufacturing scales, for example tens of 300 mm wafers per hour, if multiple multi-nozzle printheads are successfully integrated into a single system.

Once inkjet printing is complete, then a sintering process is performed to convert the encapsulated nanoparticles into continuous, conductive films. In the inkjet filling and bumping process, the die that have been filled and bumped can be isolated and placed directly onto a thermocompression bonding tool that will perform in-situ bonding and sintering. Typical bonding temperatures are on the order of 200° C. and a typical bond force of 1 N is used for approximately 1 $mm^2$ die. Pressure and temperature are applied during a bond time, such as between 5 and 15 minutes, which is sufficient to establish a proper bond in terms of electrical and mechanical interconnection. The time and temperatures required for effective bonding and sintering will be dictated strongly by the properties of the nanoparticle ink, and custom-synthesized inks are expected to enable sintering/bonding temperatures well below 200° C. if the bond energies between the encapsulant and nanoparticle are engineered to break at sufficiently low temperatures.

Practical implementation of the technology described herein requires that a number of elements of the design be properly considered. High precision stages, alignment, and ultra-fine drop dimensions are required in order to fully scale the process to very high density applications. It will be appreciated that a 0.1 pL droplet has approximately a 5 µm diameter which is at the lower end of stability for drop formation from an inkjet printhead. Using existing off-the-shelf devices, inkjet-printed TSV filling is generally suited for low- to medium-density applications, such as approximately 100 $TSVs/mm^2$ with a TSV radius of 25 µm and pitch of 100 µm.

Inkjet technologies have yet to be demonstrated in large scales, such as on a wafer scale basis, although it is expected this can be achieved with multiple high nozzle count printhead assemblies integrated into a single unit.

Proper tuning of nanoparticle ink formulations will be specific to a given application to optimize large scale use. Creation of custom inks should allow increasing their reliability, shelf-life, and even more importantly the thermal budgets required for sintering these nanoparticle inks. Thermal budgets are important as the process of de-encapsulating nanoparticles in a confined trench may result in incomplete sintering of the material, which would result in increased TSV resistance and degraded package performance.

The inventive inkjet printing process requires heated substrates in order to properly fill and bump the TSV.

However, the heat rising from use of a heated substrate can cause undesired evaporation of the solvent at the head of the nozzle before drop ejection. If the heat is sufficient to cause rapid evaporation, the nozzle may either partially or fully clog, resulting in either deflected or completely blocked droplet ejection. In a preferred embodiment of the technology described herein, the camera and video recognition software are configured for detecting the correspondence between an inkjet pulse being output (e.g., blocks 28 and 30 of FIG. 1) and a droplet of ink being ejected onto the TSV as captured by the camera (e.g., block 34 of FIG. 1). On the basis of this comparison, the software detects when drops are blocked or improperly ejected from the printhead. As a high-throughput printing solution could require nozzle counts on the order of $10^3$, the mean time between failure (MTBF) of nozzle drop ejection may need to be addressed, for example an automated means for rapidly cleaning printheads without the need of removal.

Despite the issues with inkjet printing of TSVs, there are significant advantages of the approach compared to current and potential alternatives. None of the conventional or potential alternative solutions offer a method for both filling and bumping TSVs in a single processing step. This advantage is potentially the most compelling benefit of inkjet processing over conventional techniques for packaging.

The conventional and potential alternative approaches are largely subtractive techniques by which blanket layers of material are deposited and subsequently removed, thus increasing the number of processing steps and the total material cost. Inkjet printing is an inherently additive process, and thus both processing steps and material cost are generally much lower for this inkjet printing technique. In addition, inkjet printing can be adjusted on the fly, meaning visual feedback systems are often integrated into the system as previously described in order to provide real-time deposition performance metrics and permit process pausing/adjustment if these metrics are out of pre-defined tolerance levels.

As TSV dimensions continue to scale down, void-free filling of copper TSVs could become a concern, however, special electroplating solutions may wholly overcome these issues.

Trench filling with conventional techniques leads to a well-described "keep-out-zone" where transistors should not be processed due to the induced strain in the device layer caused by CTE mismatch between silicon and the via fill material. Because nanoparticle inks can be engineered to include additional materials and the thermal processing requirements of the nanoparticle ink may be controlled, there is reason to believe the induced stress in these nanoparticle-based systems may be less than conventional techniques.

The sintering temperature of nanoparticle-based materials is a strong function of the nanoparticle size as well as the strength of the bonds for the encapsulant around the nanoparticles. This results in a large, unexplored area for the refinement of nanoparticle inks to further reduce thermal budgets. If the processing temperature is sufficiently low, then new substrate technologies (e.g., plastics, paper, and so forth) could become practical for integrating and stacking components.

There are numerous elements of the technology described herein that may be varied to meet the specific needs of chip-stacking. Due to the synthetic nature of nanoparticle inks, a wide variety of materials, including single metal cores as well as alloyed materials may be introduced into the system. To avoid CTE mismatch issues common in conventional TSVs, new materials may be introduced into the ink toward reducing effective CTE of the filled trench, potentially by tuning the encapsulant material such that as it diffuses outward toward the TSV wall it establishes a CTE gradient from the silicon substrate to the coalesced nanoparticle film.

Due to the projected architecture of a large-scale system, multiple nozzles will be integrated into the system, which allows for multiplexing the materials that are deposited in a single process flow. For example, some nozzles may deposit inks that act as barrier layers or aid in the surface wetting properties of the substrate, enhancing drop placement and accuracy.

As previously explained, the process of integrating bumps directly onto the TSVs can be simply controlled by selecting the amount of ink to deposit, for example choosing the appropriate number of drops to deposit, or using automated visual systems to monitor the filling process to meet a threshold condition. In addition, thin-film surface traces may easily be integrated into the process by simply printing lines on the surface that would connect TSVs to other TSVs or other features on the substrate.

The technology described herein may employ sub-surface heating in order to fabricate the void-free TSV. Rather than directly applying heat, an alternative is the use of infrared radiation directed through the back of the wafer to provide a higher resolution alternative for achieving the same effect. Laser radiation sourced from above the substrate surface may also be used to evaporate the deposited solvent rather than thermal or infrared radiation sourced from beneath the substrate; this is particularly well-suited for use during the bumping process. Other known forms of heating may be alternatively utilized, and combinations thereof, without departing from the teachings of the technology described herein.

After fabrication, the TSVs as described undergo a final thermal treatment in order to bond and reflow to finalize connection. Providing this treatment during bonding, however, may be optional. For example, fully-filled TSVs may be annealed during deposition if sufficient infrared or thermal radiation is applied, may be separately annealed before the bumping process begins, or may be fully annealed after the bumping process is completed but before the bonding process begins. If the latter option is chosen, thermosonic bonding rather than thermocompression bonding would be a reasonable alternative for bonding chips.

Embodiments of the present technology may be described with reference to flowchart illustrations of methods and systems according to embodiments of the technology, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula(e), or computational depiction(s).

It will further be appreciated that the terms "programming" or "program executable" as used herein refer to one or more instructions that can be executed by a processor to perform a function as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors. It will further be appreciated that as used herein, that the terms processor, computer processor, central processing unit (CPU), and computer are used synonymously to denote a device capable of executing the instructions and communicating with input/output interfaces and/or peripheral devices.

From the description herein, it will be appreciated that that the present disclosure encompasses multiple embodiments which include, but are not limited to, the following:

1. A method for filling through-silicon vias (TSVs) in an integrated circuit, the method comprising: (a) positioning an inkjet printhead, or a first integrated circuit, so that droplets ejected from the inkjet printhead are directed into a through-silicon via (TSV) to be filled in said first integrated circuit; (b) ejecting sufficiently small droplets of a conductive nanoparticle ink from said inkjet printhead into said TSV; (c) heating said integrated circuit to drive evaporation of a solvent carrying conductive nanoparticles, within said conductive nanoparticle ink, while not de-encapsulating the conductive nanoparticles; (d) inducing relative motion between the integrated circuit and the inkjet printhead along the length of the TSV while it is being filled; (e) determining that the TSV has been sufficiently filled; and (f) repeating steps (a) through (e) for all TSV to be filled on said first integrated circuit, whereby said first integrated circuit is prepared for bonding to a second integrated circuit in a process which includes a bonding temperature above a sintering temperature of nanoparticles in the conductive nanoparticle ink to form electrical interconnection between the first integrated circuit and the second integrated circuit.

2. The method of any preceding embodiment, wherein said filling of the through-silicon via (TSV) is performed until a sufficient bump of nanoparticle ink extends beyond the surface of the integrated circuit over the TSV.

3. The method of any preceding embodiment, wherein said heating retains said integrated circuit at an elevated temperature up to approximately 300° C.

4. The method of any preceding embodiment, wherein said positioning and inducing of relative motion is provided by movement of a translation stage upon which said first integrated circuit is held.

5. The method of any preceding embodiment, wherein said conductive nanoparticle ink comprises a metallic nanoparticle ink.

6. The method of any preceding embodiment, wherein said printhead utilizes piezoelectric pulses to emit picoliter sized drops of the conductive nanoparticle ink.

7. The method of any preceding embodiment, wherein said picoliter sized drops can be of a size slightly less than a picoliter up to tens of picoliters.

8. The method of any preceding embodiment, wherein said droplets of conductive nanoparticle ink ejected from the inkjet printhead have a drop diameter less than or equal to the width of the through-silicon via (TSV) being filled.

9. The method of any preceding embodiment, wherein nanoparticles within said conductive nanoparticle ink fills in the selected TSVs to form a conductive plug upon sintering.

10. The method of any preceding embodiment, further comprising heating a nozzle of the printhead to offset convective effects arising from printhead operation above said first integrated circuit which is being heated.

11. The method of any preceding embodiment, wherein said ejecting of droplets of conductive nanoparticle ink is performed in response to tuning of pulse waveforms by altering pulse voltage, dwell and echo times.

12. The method of any preceding embodiment, wherein said method facilitates three-dimensional stacking of multiple integrated circuits toward increasing effective circuit functionality per area.

13. The method of any preceding embodiment, wherein determining that the TSV has been sufficiently filled comprises determining that a predetermined number of droplets have been ejected with respect to size of the TSV being filled.

14. The method of any preceding embodiment, wherein determining that the TSV has been sufficiently filled is performed in response to automated video recognition that a desired fill shape of the TSV has been obtained.

15. A method for filling through-silicon vias (TSVs) in an integrated circuit and bonding with another integrated circuit, the method comprising: (a) positioning an inkjet printhead, or a first integrated circuit, so that droplets ejected from the inkjet printhead are directed into a through-silicon via (TSV) to be filled in said first integrated circuit; (b) ejecting sufficiently small droplets of a conductive nanoparticle ink from said inkjet printhead into said TSV; (c) heating said integrated circuit to drive evaporation of a solvent carrying conductive nanoparticles, within said conductive nanoparticle ink, while not de-encapsulating the conductive nanoparticles; (d) inducing relative motion between the integrated circuit and the inkjet printhead along the length of the TSV while it is being filled; (e) determining that the TSV has been filled until a sufficient bump of nanoparticle ink extends beyond the surface of the integrated circuit over the TSV; (f) repeating steps (a) through (e) for all TSV to be filled on said integrated circuit; and (g) physically bonding said first integrated circuit to a second integrated circuit in response to bringing filled TSVs from the first integrated circuit into contact with TSVs of the second integrated circuit, and then performing thermocompression bonding at a temperature above a sintering temperature of nanoparticles in the conductive nanoparticle ink, resulting in forming electrical interconnection between the first integrated circuit and the second integrated circuit.

16. An apparatus for filling through-silicon vias (TSVs) on an integrated circuit in preparation for three dimensional bonding, the apparatus comprising: (a) at least one inkjet printhead configured for ejecting droplets of conductive nanoparticle ink; (b) an integrated circuit stage configured for retaining an integrated circuit proximal said inkjet printhead; (c) means for heating the integrated circuit on said integrated circuit stage; (d) means for inducing relative motion between said inkjet printhead and said integrated circuit stage; (e) at least one processor connected to control said at least one inkjet printhead, said integrated circuit stage, said means for heating, and said means for inducing relative motion; (f) programming executable on said processor to fill through-silicon vias (TSVs) on the integrated circuit retained on said integrated circuit stage, with said processing comprising: (f)(i) controlling said heating means to a sufficient temperature to drive evaporation of solvent carrying conductive nanoparticles; (f)(ii) controlling said means for inducing relative motion so that droplets of conductive nanoparticle inks ejected from said printhead are directed into a selected through silicon via (TSV) of the integrated circuit; (f)(iii) driving said printhead to eject one or more droplets of conductive nanoparticle ink; (f)(iv) controlling said means for inducing relative motion so that droplets of conductive nanoparticle inks are ejected to reach along the length of the selected TSV until it is filled; and (f)(v) repeating steps (f)(ii) through (f)(iv) until all desired TSV of the integrated circuit have been filled and bumped; (g) whereby after step (f) the integrated circuit is ready for removal from said stage for thermocompression bonding, at a temperature above the sintering temperature of the nanoparticles in the conductive nanoparticle ink, to provide interconnection with another integrated circuit.

17. The apparatus of any preceding embodiment, wherein said filling of the through-silicon via (TSV) is performed until a sufficient bump of nanoparticle ink extends beyond the surface of the integrated circuit over the TSV.

18. The apparatus of any preceding embodiment, wherein said means for heating an integrated circuit comprises a heating element retained within or coupled to said integrated circuit stage.

19. The apparatus of any preceding embodiment, wherein said means for heating is configured for retaining said integrated circuit at an elevated temperature up to approximately 300° C.

20. The apparatus of any preceding embodiment, wherein said means for inducing relative motion between said inkjet printhead and said integrated circuit stage comprises a motor drive coupled to said integrated circuit stage.

21. The apparatus of any preceding embodiment, wherein said conductive nanoparticle ink comprises a metallic nanoparticle ink.

22. The apparatus of any preceding embodiment, wherein said printhead comprises a piezoelectric printhead which emits droplets of the nanoparticle ink which are slightly less than a picoliter up to approximately 50 picoliters.

23. The apparatus of any preceding embodiment, further comprising: a nozzle heater on a nozzle of said printhead; and programming executable on said computer and configured to control said nozzle heater to control nozzle temperature to offset convective effects arising from printhead operation above said means for heating an integrated circuit.

24. The apparatus of any preceding embodiment, further comprising programming executable on said processor for tuning of pulse waveforms driving said printhead by altering pulse voltage, dwell and echo times.

25. The apparatus of any preceding embodiment, wherein said apparatus facilitates three-dimensional stacking of integrated circuits toward increasing effective circuit functionality per area.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A method for filling through-silicon vias (TSVs) in an integrated circuit, the method comprising:
    (a) positioning an inkjet printhead, or a first integrated circuit, so that droplets ejected from the inkjet printhead are directed into a through-silicon via (TSV) to be filled in said first integrated circuit;
    (b) ejecting sufficiently small droplets of a conductive nanoparticle ink from said inkjet printhead into said TSV;
    (c) heating said integrated circuit to drive evaporation of a solvent carrying conductive nanoparticles within said conductive nanoparticle ink;
    (d) inducing relative motion between the integrated circuit and the inkjet printhead along the length of the TSV while it is being filled;
    (e) determining that the TSV has been sufficiently filled by determining that a predetermined number of droplets have been ejected with respect to size of the TSV being filled; and
    (f) repeating steps (a) through (e) for all TSV to be filled on said first integrated circuit, whereby said first integrated circuit is prepared for bonding to a second integrated circuit in a process which includes a bonding temperature above a sintering temperature of nanoparticles in the conductive nanoparticle ink to form electrical interconnection between the first integrated circuit and the second integrated circuit.

2. The method of claim 1, wherein said filling of the through-silicon via (TSV) is performed until a sufficient bump of nanoparticle ink extends beyond the surface of the integrated circuit over the TSV.

3. The method of claim 1, wherein said heating retains said integrated circuit at an elevated temperature up to approximately 300° C.

4. The method of claim 1, wherein said positioning and inducing of relative motion is provided by movement of a translation stage upon which said first integrated circuit is held.

5. The method of claim 1, wherein said conductive nanoparticle ink comprises a metallic nanoparticle ink.

6. The method of claim 1, wherein said printhead utilizes piezoelectric pulses to emit picoliter sized drops of the conductive nanoparticle ink.

7. The method of claim 6, wherein said picoliter sized drops can be of a size slightly less than a picoliter up to tens of picoliters.

8. The method of claim 1, wherein said droplets of conductive nanoparticle ink ejected from the inkjet printhead have a drop diameter less than or equal to the width of the through-silicon via (TSV) being filled.

9. The method of claim 1, wherein nanoparticles within said conductive nanoparticle ink fills in the selected TSVs to form a conductive plug upon sintering.

10. The method of claim 1, further comprising heating a nozzle of the printhead to offset convective effects arising from printhead operation above said first integrated circuit which is being heated.

11. The method of claim 1, wherein said inkjet printhead further comprises a piezoelectric control mechanism with pulse waveforms; and
wherein said ejecting of droplets of conductive nanoparticle ink is performed in response to tuning of pulse waveforms by altering pulse voltage, dwell and echo times.

12. The method of claim 1, wherein said method facilitates three-dimensional stacking of multiple integrated circuits toward increasing effective circuit functionality per area.

13. The method of claim 1, wherein determining that the TSV has been sufficiently filled is performed in response to automated video recognition that a desired fill shape of the TSV has been obtained.

14. A method for filling through-silicon vias (TSVs) in an integrated circuit and bonding with another integrated circuit, the method comprising:
(a) positioning an inkjet printhead, or a first integrated circuit, so that droplets ejected from the inkjet printhead are directed into a through-silicon via (TSV) to be filled in said first integrated circuit;
(b) ejecting sufficiently small droplets of a conductive nanoparticle ink from said inkjet printhead into said TSV;
(c) heating said integrated circuit to drive evaporation of a solvent carrying conductive nanoparticles within said conductive nanoparticle ink;
(d) inducing relative motion between the integrated circuit and the inkjet printhead along the length of the TSV while it is being filled;
(e) determining that the TSV has been filled by determining that a predetermined number of droplets have been ejected with respect to size of the TSV being filled until a sufficient bump of nanoparticle ink extends beyond the surface of the integrated circuit over the TSV;
(f) repeating steps (a) through (e) for all TSV to be filled on said integrated circuit; and
(g) physically bonding said first integrated circuit to a second integrated circuit in response to bringing filled TSVs from the first integrated circuit into contact with TSVs of the second integrated circuit, and then performing thermocompression bonding at a temperature above a sintering temperature of nanoparticles in the conductive nanoparticle ink, resulting in forming electrical interconnection between the first integrated circuit and the second integrated circuit.

15. An apparatus for filling through-silicon vias (TSVs) on an integrated circuit in preparation for three dimensional bonding, the apparatus comprising:
(a) at least one inkjet printhead configured for ejecting droplets of conductive nanoparticle ink;
(b) an integrated circuit stage configured for retaining an integrated circuit proximal said inkjet printhead;
(c) means for heating the integrated circuit on said integrated circuit stage;
(d) means for inducing relative motion between said inkjet printhead and said integrated circuit stage;
(e) at least one processor connected to control said at least one inkjet printhead, said integrated circuit stage, said means for heating, and said means for inducing relative motion;
(f) programming executable on said processor to fill through-silicon vias (TSVs) on the integrated circuit retained on said integrated circuit stage, with said processing comprising:
(f)(i) controlling said heating means to a sufficient temperature to drive evaporation of solvent carrying conductive nanoparticles;
(f)(ii) controlling said means for inducing relative motion so that droplets of conductive nanoparticle inks ejected from said printhead are directed into a selected through silicon via (TSV) of the integrated circuit;
(f)(iii) driving said printhead to eject one or more droplets of conductive nanoparticle ink;
(f)(iv) controlling said means for inducing relative motion so that droplets of conductive nanoparticle inks are ejected to reach along the length of the selected TSV until it is filled; and
(f)(v) repeating steps (f)(ii) through (f)(iv) until all desired TSV of the integrated circuit have been filled and bumped.

16. The apparatus of claim 15, wherein said filling of the through-silicon via (TSV) is performed until a sufficient bump of nanoparticle ink extends beyond the surface of the integrated circuit over the TSV.

17. The apparatus of claim 15, wherein said means for heating an integrated circuit comprises a heating element retained within or coupled to said integrated circuit stage.

18. The apparatus of claim 17, wherein said means for heating is configured for retaining said integrated circuit at an elevated temperature up to approximately 300° C.

19. The apparatus of claim 15, wherein said means for inducing relative motion between said inkjet printhead and said integrated circuit stage comprises a motor drive coupled to said integrated circuit stage.

20. The apparatus of claim 15, wherein said conductive nanoparticle ink comprises a metallic nanoparticle ink.

21. The apparatus of claim 15, wherein said printhead comprises a piezoelectric printhead which emits droplets of the nanoparticle ink which are slightly less than a picoliter up to approximately 50 picoliters.

22. The apparatus of claim 15, further comprising:
a nozzle heater on a nozzle of said printhead; and
programming executable on said computer and configured to control said nozzle heater to control nozzle temperature to offset convective effects arising from printhead operation above said means for heating an integrated circuit.

23. The apparatus of claim 15, further comprising:
a piezoelectric control mechanism with pulse waveforms; and
programming executable on said processor for tuning of pulse waveforms driving said piezoelectric printhead control mechanism by altering pulse voltage, dwell and echo times.

24. The apparatus of claim 15, wherein said apparatus facilitates three-dimensional stacking of integrated circuits toward increasing effective circuit functionality per area.

\* \* \* \* \*